United States Patent [19]

Roth

[11] 4,256,356
[45] Mar. 17, 1981

[54] APPARATUS FOR INSERTING AND WITHDRAWING SUBASSEMBLIES

[75] Inventor: Walter Roth, Wutöschingen Hochrhein, Fed. Rep. of Germany

[73] Assignee: BBC Brown, Boveri & Company, Limited, Baden, Switzerland

[21] Appl. No.: 17,427

[22] Filed: Mar. 5, 1979

[30] Foreign Application Priority Data

Mar. 6, 1978 [CH] Switzerland ............... 2377/78

[51] Int. Cl.³ ............................................. H05K 5/00
[52] U.S. Cl. ................................. 312/320; 312/101; 339/17 LC
[58] Field of Search ............. 312/273, 320, 101; 339/17 LC, 75 M; 211/41

[56] References Cited

U.S. PATENT DOCUMENTS

| T876,004 | 7/1970 | Andreini et al. | |
|---|---|---|---|
| 2,609,268 | 9/1952 | Nye | 312/320 |
| 3,193,342 | 7/1965 | Sauter | 312/320 |
| 3,294,463 | 12/1966 | Kafferlin et al. | 312/320 |
| 3,367,732 | 2/1968 | Beye | 312/320 |
| 3,767,974 | 10/1973 | Donovan | 361/415 |
| 3,798,507 | 3/1974 | Damon | 361/415 |

FOREIGN PATENT DOCUMENTS

| 2,708,078 | 9/1977 | Fed. Rep. of Germany |
|---|---|---|
| 7,602,333 | 5/1976 | Fed. Rep. of Germany |
| 7,724,549 | 1/1978 | Fed. Rep. of Germany |

| 936288 | 9/1963 | United Kingdom . |
|---|---|---|
| 1269040 | 3/1972 | United Kingdom . |

Primary Examiner—Casmir A. Nunberg
Attorney, Agent, or Firm—Oblon, Fisher, Spivak, McClelland & Maier

[57] ABSTRACT

In equipment in which a number of plug-in subassemblies, such as printed circuit boards, for example, are arranged, the printed circuit boards are usually inserted in resilient strips of plug-in connectors for the purpose of establishing electrical contact for the conduction strips arranged on the printed circuit boards. These resilient strips are fixed to the rear portion of the supporting frame of the equipment. Appreciable force and satisfactory guidance are required for inserting and withdrawing the plug-in subassemblies. For the purpose of inserting or withdrawing the plug-in subassembly a lever is arranged in a rotary bearing on the plug-in subassembly. Toothed wheel segments are provided at the end of the shorter lever arm of this lever and engage in toothed rack sections of a profile strip which is substantially horizontally positioned. When the lever is actuated, the toothed wheel segments roll in the rack sections. For locking the lever, when the plug-in subassembly has assumed its inserted condition, a locking element, which is provided in the lever handle, comes into engagement with a locking projection which is movably mounted in a recess in the front plate of the plug-in subassembly. The locked condition is disengaged by pushing up the actuator 18.

11 Claims, 4 Drawing Figures

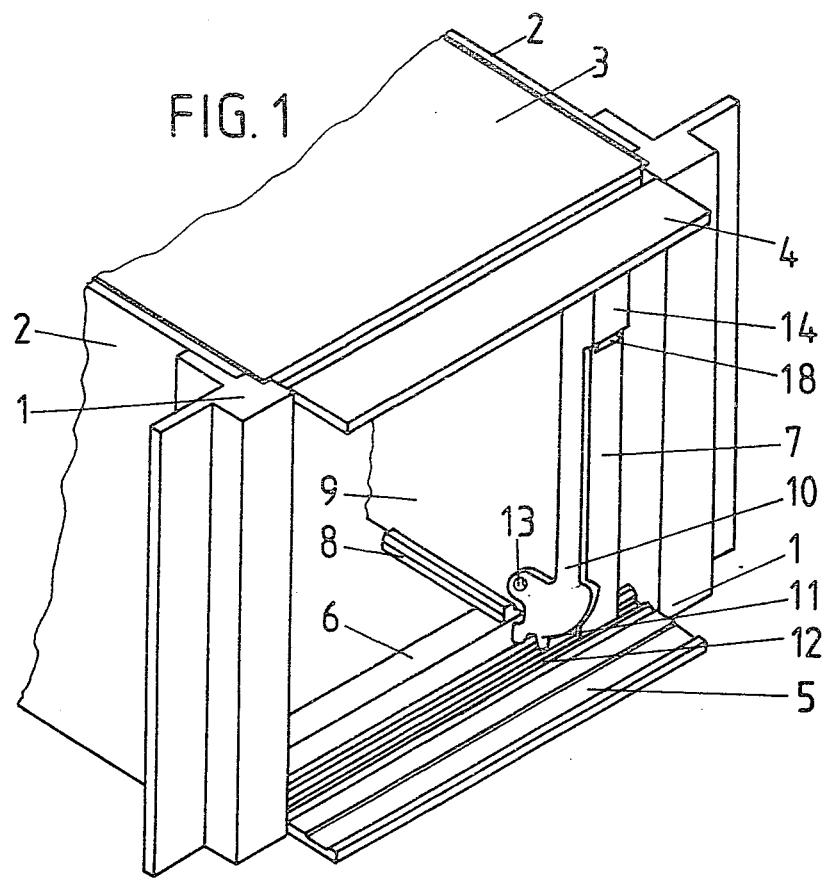
FIG. 1
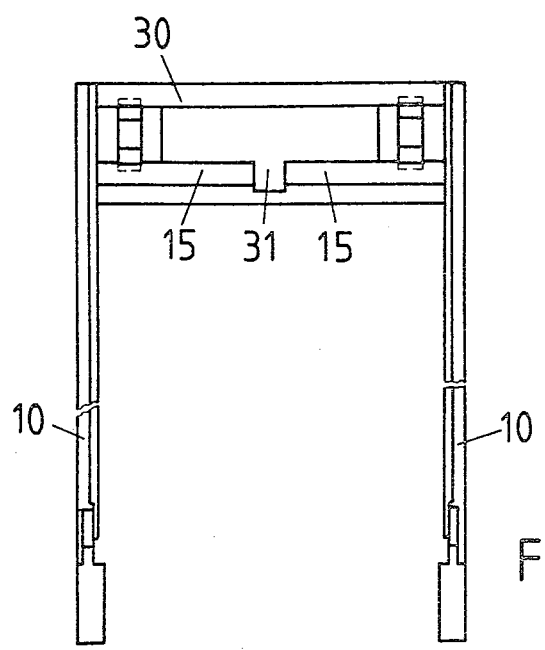
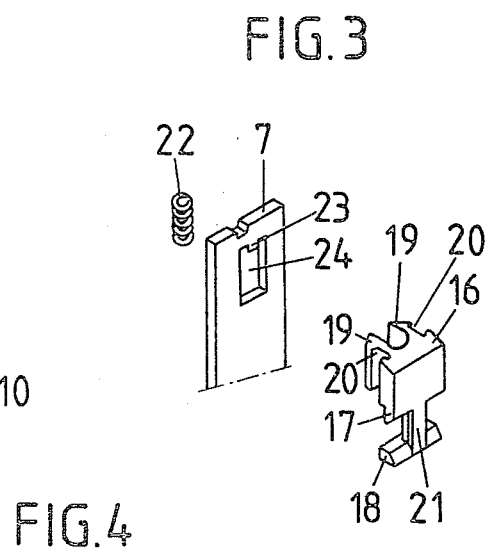
FIG. 3
FIG. 4

APPARATUS FOR INSERTING AND WITHDRAWING SUBASSEMBLIES

BACKGROUND OF THE INVENTION

1. Field of the Invention

The invention relates to an apparatus for inserting and withdrawing subassemblies in subassembly holders. A lever which is rotatably mounted on the subassembly and whose arms differ from each other, a locking element arranged on the longer lever arm, that is to say on the arm lying closer to the lever handle, and a shifter element arranged on the shorter lever arm engage with a profile strip which is fixed to the subassembly holder to make up the subassembly.

2. Description of the Prior Art

Insertion and retraction apparatuses facilitate the insertion and withdrawal of printed circuit boards or of subassemblies for electric and electronic components or inserts. At the same time these apparatuses enable the subassemblies to be locked or immobilized in the inserted or plugged-in condition.

Insertion and retraction apparatuses of this kind are commercially available as card extractors. In the case of these known apparatuses, the lever, which is used for extracting and inserting cards with printed circuits, or printed circuit boards, engages, by means of a trapezoidal shifter element provided on the shorter, lower lever arm, in an n-shaped recess of a profiled strip, which is connected to the guide strip of the plate. The torque exerted when the lever is actuated is transmitted to the front or rear wall of the n-shaped recess, resulting in the mutually contacting surfaces or sections, along which the force transmission takes place, sliding on one another. The locking apparatus is disposed below the forwardly-bent handle. For high printed circuit boards, i.e. so-called "double Europe cards", profiled strips with card extractors of this kind are arranged on the upper and lower frame of the subassembly holder.

SUMMARY OF THE INVENTION

An object of the present invention is the provision of a lockable insertion and retraction apparatus, which prevents each subassembly which is provided with this apparatus, from accidentally slipping out, and enables the subassembly to be inserted relatively deep into, and withdrawn from, a subassembly holder, this insertion and withdrawal taking place simply and without the use of a tool.

The effect of the invention is that the sliding friction, occurring during actuation of the lever, is replaced by a rolling friction between the shifter element in the shorter lever arm and the walls of the profile plate into which this shifter element engages. By shaping these interacting components as toothed wheel segments and a toothed rack section, a longer path of sliding motion becomes possible than is the case with the known card extractor. Manufacture of the interacting components having this profile shape is uncomplicated. Accommodating the locking element in the lever handle makes it possible to give the lever a simple shape, and the locking member may be concealed when the lever is in the locked position, except the actuator which projects under the lever handle. The locking member is guided in a recess of the front plate and is vertically shiftable.

By means of the insertion and retraction apparatus according to the invention, not only can individual components, such as printed circuit boards of example, be retracted, inserted and locked in this inserted position, but also larger composite subassemblies when two such levers interconnected by way of an arcuate portion or handle bridge so as to form a double lever are used. This double lever is mounted on the outer side plates of the subassembly. In this case the locking element is preferably arranged on the handle bridge and thus is susceptible to actuation with one hand.

A further advantage resides in the fact that, in the case of subassemblies of relatively large height, only one insertion and retraction apparatus is required instead of two such apparatuses, as has hitherto been the case.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views, and wherein:

FIG. 1 is a partial perspective view of the front part of a first embodiment of the subassembly holder, with a subassembly and with an apparatus for inserting and withdrawing this subassembly;

FIG. 3 is a partial, perspective exploded view of the front portion of a subassembly and of the locking member with associated helical spring, and FIG. 4 illustrates a second embodiment of the invention constituted as a double lever with a connecting bridge for compact subassemblies.

DETAILED DESCRIPTION OF THE PREFERRED EMBODIMENTS

Figure 2:
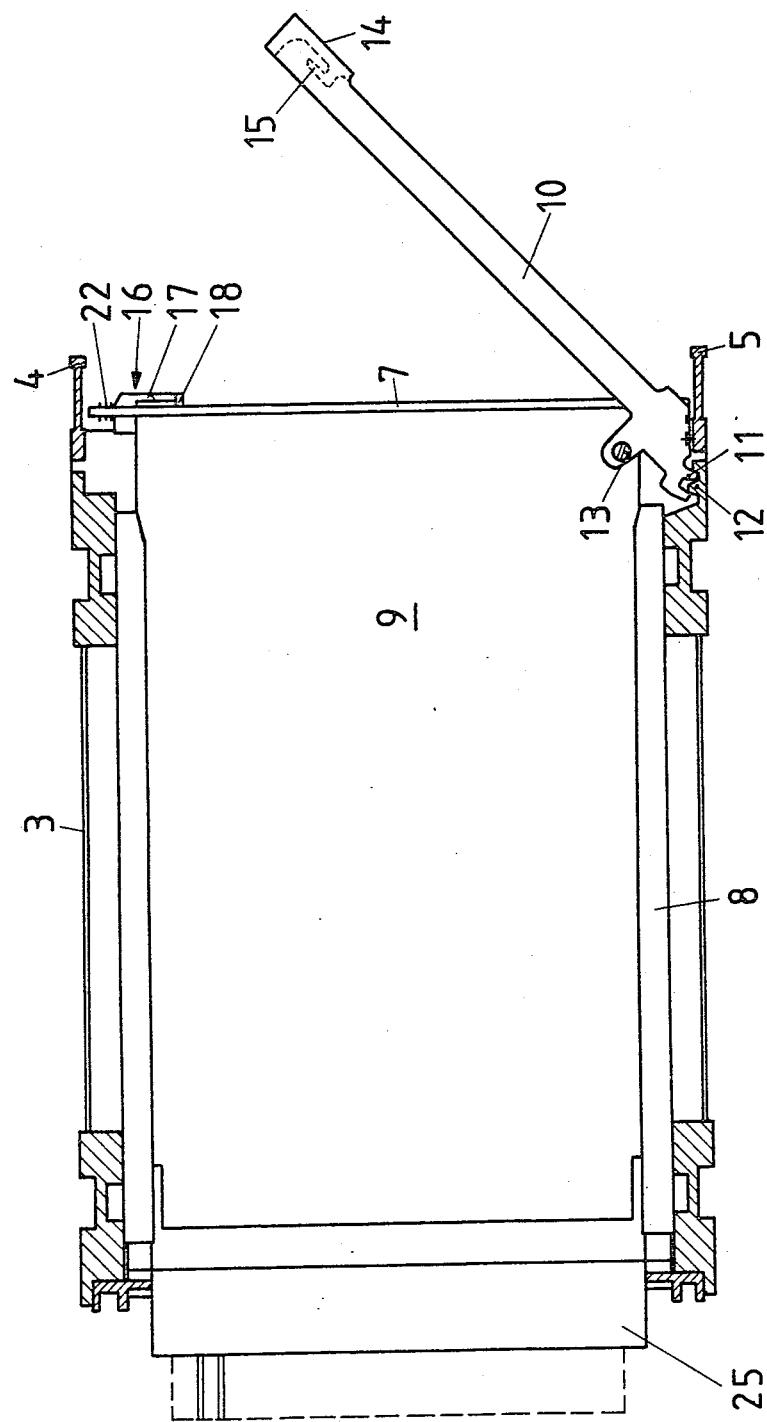
FIG. 2 is a side elevational view of a subassembly which is constructed as shown in FIG. 1 and is partially withdrawn.

Similar components are designated by the same reference symbols in the Figures.

The subassembly holder or carrier shown in FIG. 1 comprises a supporting frame 1 with side plates 2 attached to it, and also a cover plate 3, upper and lower locking or inscription-plates 4 and 5, and a front profile plate 6. A subassembly or printed circuit board (panel) 9 is slidably guided in a guide strip 8. A lever 10 is used for withdrawing the printed circuit board 9 and also for inserting this board 9 and locking it in its inserted position; this lever 10 is connected to the printed circuit board 9 by means of a rotary pin 13. Shifter or toothed wheel-segments 11 are provided on the shorter arm of lever 10 and can engage in a substantially horizontally-positioned toothed rack section or profile plate 12. An actuator 18 for securing or locking the position of the lever 10 projects below the lever handle 14 on a faceplate 7 connected to the printed circuit board 9. The locking or inscription-plates 4 and 5, which are illustrated in the disengaged horizontal position, cover the upper and lower parts of the lever 10, and also the profile plate 12, in the locked vertical position, which otherwise would be deleteriously effected.

When in its immobilized or locked position, and when the subassembly has been inserted, the lever 10 is in an approximately vertical position. The rotary pin 13 of this lever 10 lies substantially vertically above the toothed wheel segment 11. A screw can be used as the rotary bearing. The (toothed) rack section 12 is secured to the profile plate 6, the guide strip 8, and to the supporting frame 1.

In FIG. 2 a locking element or lug 15 is shown, in dotted line, in the lever handle 14.

In the partially withdrawn position the lower end of the subassembly or printed circuit board 9 is already out of engagement with respect to a resilient plate 25, which is secured to the rear part of the supporting frame.

Details of a locking member 16, which is made of a resilient material, can be best seen in FIG. 3. The locking member 16 has a locking projection 17 which does not extend to the central part, a locking actuator 18 which is connected to this central part or bridge 21, and, in its upper rear part, a guide element 19. On its face the locking projection 17 has an oblique surface against which the locking lug or nose 15 assumes a position of abutment when the lever 10 is pressed in. The locking lug 15 has an interruption in its central area. The width of this interrupted area or opening corresponds to the width of the bridge 21 on the locking member 16. This width is slightly greater than the width of the bridge 21. The guide element 19 has, in the central part of the locking member 16, a vertical non-continuous U-shaped opening, into which a helical spring 22, which is subject to only slight biasing force, is inserted, and, in its vertical position, is prevented from accidentally falling out by a projection 23 in the upper center part of a recess 24 in the front 7 of the subassembly. Two continuous, symmetrical, substantially n-shaped openings 20 are provided along the outside of the arms or shanks of the U-shaped recess; the locking member 16 is guided by these openings 20 at the lateral confines of the opening 24 in the front plate 7. For introducing the locking member 16 into the recess 24 of the front plate 7, the guide element 19 is slightly compressed and is then pushed in from the front. The height of the recess 24 is greater than the height of the guide element 19. The width of this recess 24 substantially equals the outer dimension of the n-shaped openings 20 of the guide element 19.

In the locked, vertical position of the lever 10, the actuator 18 projects below the lever handle 14 on the front face of the front plate 7. This actuator 18 preferably has a vertically upwardly-directed arrow-like shape, which is intended to indicate the actuating direction when the subassembly is being secured (i.e. locked) in position.

The inserting and retracting apparatus of the kind illustrated in FIGS. 1 to 3, functions in the following way. In the vertical position of the lever 10, shown in FIG. 1, the subassembly or printed circuit board 9 is inserted, and is locked in this inserted position by way of the locking element 15 in the lever handle 14 and by way of the locking projection 17 in the locking member 16. For withdrawing the subassembly or printed circuit board 9, the actuator 18 is pressed upward towards the lever handle 14, and the lever 10 on the handle 14 turned in the clockwise direction. Through pressing the actuator 18 upward, the locking member 16 is shifted upwardly in opposition to the biasing force of the helical spring 22 until the position of mutual engagement between the locking projection 17 and the locking lug 15 is discontinued. While lever 10 is being turned in the clockwise direction, the toothed segment 11 rolls along the (toothed) rack section 12; by way of the rotary bearing 13, lever 10 pulls the subassembly or printed circuit board 9 forward. After it has been withdrawn the subassembly or printed circuit board 9 can be carried by the lever 10. For reinserting the subassembly, the printed circuit board 9 has to be introduced into a groove in the guide strip 8, and the toothed segment 11 into the (toothed) rack section 12. Lever 10 then has to be turned in the counterclockwise direction until the position or locking engagement is restored.

Naturally, the invention is not restricted to the subject matter illustrated in FIGS. 1 to 3. Thus, and as illustrated in FIG. 4, the lever may be replaced by a double lever in which two levers 10 are rigidly interconnected by a handle bridge 30 arranged close to the lever handle. The locking member 16 is preferably positioned behind (in respect to the locked position of the double lever) the center of the bridge 30 of the lever handle. Accordingly, the interruption 31, corresponding to the width of the bridge 21 on the locking member 16, in the locking lug 15 is arranged in the middle of the bridge 30 of the lever handle. This insertion and retraction apparatus is particularly suitable for compact subassemblies which are composed of a number of printed circuit boards, and in the case of which appreciable force is required for inserting and withdrawing the subassemblies.

The insertion and retraction apparatus according to the invention is particularly suitable for electronic subassemblies but also for other equipment in which a number of subassemblies are combined.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for inserting and withdrawing subassemblies in subassembly holders, comprising:
   a front plate on said subassembly;
   a lever having two arms and being rotatably mounted in said subassembly;
   a locking element on a longer arm of said lever, said longer arm including a handle in which said locking element is located;
   a shifter element on the shorter arm of said lever;
   a profile plate fixed to said subassembly holder, said shifter element projecting into the profile portion of said profile plate, said shifter element comprising a toothed wheel segment and said profile plate having the profile of a horizontal toothed rack section; and
   a locking member movably disposed in a recess in said front plate of said subassembly; wherein said locking member comprises a guide element with a vertical U-shaped opening lying in its center, said U-shaped opening being not continuous in the lower part of said guide element, two symmetrical substantially n-shaped openings along the outside of the shanks of said U-shaped opening, and an actuator which is positioned at the front of, and is connected to, the center part of said locking member by way of a bridge.

2. An insertion and retraction apparatus according to claim 1, wherein said locking element in said lever handle is a lever lug or nose; said locking member having a locking projection which has, at its front, an oblique surface which is directed towards said locking lug.

3. An insertion and retraction apparatus according to claim 1, wherein said locking member is made from a resilient material.

4. An apparatus for inserting and withdrawing subassemblies in subassembly holders, comprising:
- a front plate on said subassembly;
- a lever having two arms and being rotatably mounted in said subassembly;
- a locking element on a longer arm of said lever, said longer arm including a handle in which said locking element is located;
- a shifter element on the shorter arm of said lever;
- a profile plate fixed to said subassembly holder, said shifter element projecting into the profile portion of said profile plate, said shifter element comprising a toothed wheel segment and said profile plate having the profile of a horizontal toothed rack section; and
- a locking member movably disposed in a recess in said front plate of said subassembly, said locking member including an opening in said recess and containing a spring element held in said opening with a slight biasing force, said spring element holding said locking member in a closed position by the elastic force thereof.

5. An insertion and retraction apparatus according to claim 1, wherein said actuator projects, in the locked position, below said lever handle on said front plate of said subassembly, and has the shape of a vertically upwardly-directed arrow.

6. An insertion and retraction apparatus according to claim 2, wherein said locking element has, at its center, an interrupted portion or opening which corresponds to the width of said bridge of said locking member.

7. An insertion and retraction apparatus according to claim 1, or 4 wherein said recess in said front plate for receiving said locking member is rectangularly shaped; a projection extending into the central upper part of this recess, said recess lying substantially behind said handle of said lever in the locked position of said lever.

8. An insertion and retraction apparatus according to claim 1 wherein the height of said recess is greater than the height of said guide element, and the width of said recess is substantially equal to the outer dimension of said symmetrical, substantially n-shaped openings of said guide element.

9. An insertion and retraction apparatus according to claim 1 wherein a helical spring is arranged in said U-shaped opening of said guide element and, in its vertical position, is located by said projection in said recess.

10. An insertion and retraction apparatus according to claim 1 or 4 characterized in that two levers are provided and interconnected at their ends lying closer to the lever handle and by way of a bridge so as to form a double lever.

11. An insertion and retraction apparatus according to claim 10, characterized in that said locking member lies substantially opposite the center of said bridge of said handle of said double lever and, in the locked position of said double lever, engages with a locking element in said handle bridge.

* * * * *